United States Patent [19]

Teng

[11] Patent Number: 4,660,278

[45] Date of Patent: Apr. 28, 1987

[54] PROCESS OF MAKING IC ISOLATION STRUCTURE

[75] Inventor: Clarence W. Teng, Plano, Tex.

[73] Assignee: Texas Instruments Incorporated, Dallas, Tex.

[21] Appl. No.: 749,952

[22] Filed: Jun. 26, 1985

[51] Int. Cl.[4] .................... H01L 21/20; H01L 21/302
[52] U.S. Cl. .................................... 29/576 W; 29/571; 29/576 E; 148/1.5; 148/175; 156/643
[58] Field of Search ................ 29/576 W, 576 E, 571; 148/175, 1.5; 156/643

[56] References Cited

U.S. PATENT DOCUMENTS

| | | | |
|---|---|---|---|
| 4,056,413 | 11/1977 | Yoshimura | 148/175 |
| 4,101,350 | 7/1978 | Possley et al. | 148/175 |
| 4,187,125 | 2/1980 | Feist | 148/1.5 |
| 4,346,513 | 8/1982 | Nishizawa et al. | 29/580 |
| 4,467,521 | 8/1984 | Spooner et al. | 29/576 E |
| 4,526,631 | 7/1985 | Silvestri et al. | 148/175 |
| 4,528,745 | 7/1985 | Muraoka | 29/576 E |
| 4,533,429 | 8/1985 | Josquin | 29/576 W |
| 4,566,914 | 1/1986 | Hall | 148/1.5 |
| 4,574,469 | 3/1986 | Mastrioanni et al. | 29/576 W |

OTHER PUBLICATIONS

Anantha et al., IBM-TDB, 16 (1974), 3245.

Primary Examiner—Upendra Roy
Attorney, Agent, or Firm—Douglas A. Sorensen; Kenneth C. Hill; Melvin Sharp

[57] ABSTRACT

Using a structure according to one embodiment of the present invention, active elements in integrated circuitry may be completely isolated from other elements in the integrated circuitry by silicon dioxide regions surrounding the sides of the region containing the active element and a buried diffusion beneath the active element extending to all sides of the isolating silicon dioxide regions.

In one embodiment of the present invention, an isolation structure is fabricated by etching a silicon substrate to remove the silicon from the entire region occupied by the isolated active area and the isolation structure of this embodiment of the invention. A conformal layer of silicon dioxide, or other dielectric material, is then deposited on the surface of the silicon substrate. The conformal silicon dioxide layer is then anisotropically etched to remove the silicon dioxide on the bottom of the isolation region but still provide a sidewall region of silicon dioxide on the sides of the isolation region. The bottom of the isolation region is then implanted with dopant ions to provide a depletion region in the bottom of the isolation region. Crystalline silicon is then grown from the base of the isolation region to form the isolation region flush with the surface of the substrate using selective epitaxial growth.

12 Claims, 6 Drawing Figures

PROCESS OF MAKING IC ISOLATION STRUCTURE

FIELD OF THE INVENTION

The present invention relates to the field of integrated circuit fabrication. More specifically, the present invention relates to a structure and method for providing isolation between elements formed in a single substrate such as, for example, between P channel and N channel devices in complementary metal oxide semiconductor (CMOS) circuitry.

BACKGROUND OF THE INVENTION

A major goal in the fabrication of integrated circuitry is reduction of the surface area utilized to fabricate various devices. One structure which occupies a great deal of surface area is the isolation structure. A common requirement in nearly all integrated circuitry is that isolation structures must be provided between elements formed in the surface of the integrated circuit. Isolation structures attempt to provide electrical isolation between components so that, as much as possible, each element may operate independently of other elements outside of the direct and intentional interconnection of various circuit elements.

The most common method of isolation employed today is the use of field oxidation. In this structure, regions between elements are implanted with a channel stop implant and then a thick field oxide region is formed, usually by thermal growth, to form the field isolation structure. This structure provides electrically insulating oxide and a depletion region between elements in the integrated circuit. This method suffers from two major drawbacks. First, because the field oxide region must be patterned of the surface of the substrate, the field isolation structure must occupy an area at least equal to the minimum geometry provided by the lithography system used to pattern the field oxide mask. In addition, when field oxide regions are thermally grown, as is usually the case, the field oxide region expands laterally as well as vertically, thus occupying an even greater surface area. Also, the field oxide structure does not completely enclose the region containing the active element thereby leaving a direct, although extended, connection between regions containing active elements.

A particularly problematic situation caused by the second problem involves the problem of latch-up in CMOS circuitry. Latch-up occurs when an injection of spurious minority carriers causes the thyristor formed by the P-type source of the P-channel MOS transistor, which is usually connected to the positive supply voltage, the N-type tank of the P-channel transistor, the P-type well containing the N-channel transistor and the N-type source of the N-channel transistor which is usually connected to ground potential, to turn on. Thus a large current flows from positive voltage supply to ground, usually destroying the latched-up devices. Several structures have been developed to minimize the potential for latch-up; however, these structures require at least a 4 micron space between devices.

SUMMARY OF THE INVENTION

Using a structure according to one embodiment of the present invention, active elements in integrated circuitry may be completely isolated from other elements in the integrated circuitry by silicon dioxide regions surrounding the sides of the region containing the active element and a buried diffusion beneath the active element extending to the bottoms of all of the isolating silicon dioxide regions.

In one embodiment of the present invention, an isolation structure is fabricated by etching, for example, a silicon substrate to remove the silicon from the entire region to be occupied by the isolated active area and the isolation structure of this embodiment of the invention. A layer of silicon dioxide, or other dielectric material, is then formed on the surface of the silicon substrate. The conformal silicon dioxide layer is then anisotropically etched to remove the silicon dioxide on the bottom of the isolation region but still provide silicon dioxide on the sides of the isolation region. The bottom of the isolation region is then implanted with dopant ions to provide a degeneration or heavily doped region in the bottom of the isolation region. Crystalline silicon is then formed, using selective epitaxy, from the base of the isolation region until the isolation region is flush with the surface of the substrate.

DETAILED DESCRIPTION

Figure 1A:
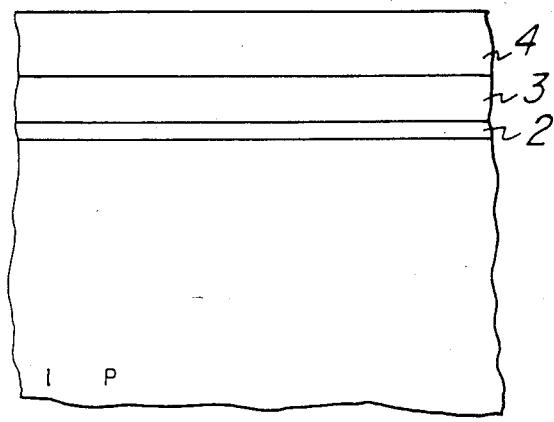
FIGS. 1A through 1E are schematic side-view diagrams depicting the processing steps necessary to fabricate one embodiment of the present invention.

FIGS. 1A through 1E are side view schematic drawings depicting the processing steps necessary to fabricate one embodiment of the present invention. Thermally grown silicon dioxide layer 2 of FIG. 1A is formed to a thickness of approximately 350 angstroms on the surface of P-type substrate 1 using techniques well known in the art. Silicon nitride layer 3 is formed on the surface of silicon dioxide layer 2 using chemical vapor deposition to a thickness approximately 1,000 to 2,000 angstroms. Photoresist layer 4 is then formed and patterned on the surface of silicon nitride layer 3.

Figure 1B:
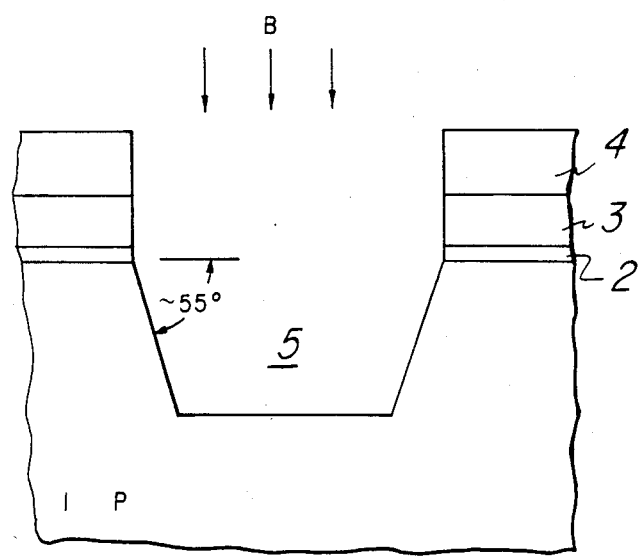
Figure 1C:
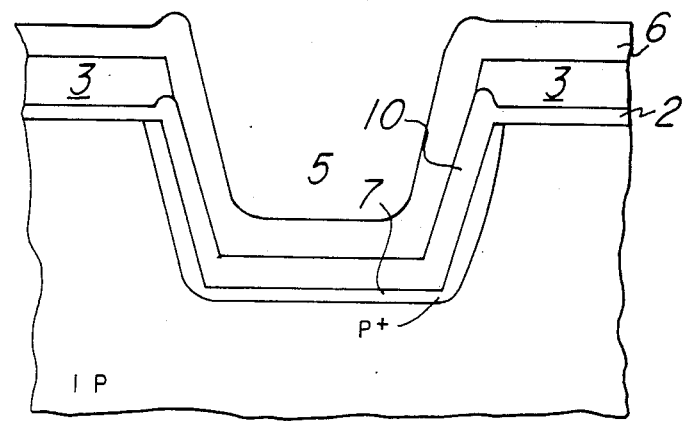

Photoresist layer 4 provides an etching mask for silicon nitride layer 3, silicon dioxide layer 2 and substrate 1. Silicon nitride layer 3 and silicon dioxide layer 2 are then etched using techniques well known in the art. Substrate 1 is then etched using orientation dependent etching processes known in the art to provide sloped sidewalls as shown by isolation area 5. For example, if substrate 1 is comprised of 1-0-0 orientation type crystalline silicon, the sidewalls of isolation region 5 will have an angle relative to the surface of substrate 1 of approximately 55 degrees as shown in FIG. 1B. The structure of FIG. 1B is then subjected to an ion implantation of boron ions having an energy of 100 kiloelectron volts and a density of approximately $1 \times 10^{12}$ ions per centimeter squared. This ion implantation is then annealed to provide P+region 7 as shown in FIG. 1C.

Photoresist layer 4 is then removed using techniques well known in the art. Silicon dioxide layer 10 is formed on the surface of isolation region 5 to a thickness of approximately 2,000 angstroms using techniques well known in the art. Polycrystalline silicon layer 6 is then formed by chemical vapor deposition to a thickness of approximately 1,000 angstroms. The structure of FIG. 1C is then subjected to an anisotropic etching process which etches polycrystalline silicon layer 6 until only polycrystalline filaments 8 remain of polycrystalline silicon layer 6. An anisotropic etching process which selectively removes silicon dioxide layer 10 in the bottom of isolation region 5 but does not etch polycrystalline filaments 8 is then performed providing the structure of FIG. 1D. Polycrystalline silicon filaments 8 are included to provide an etch mask for etching silicon dioxide layer 10 in the bottom of isolation region 5 and provide good adhesion of subsequently deposited selective epitaxial silicon. Other suitale materials may be substitued for polycrystalline silicon.

Figure 1D:
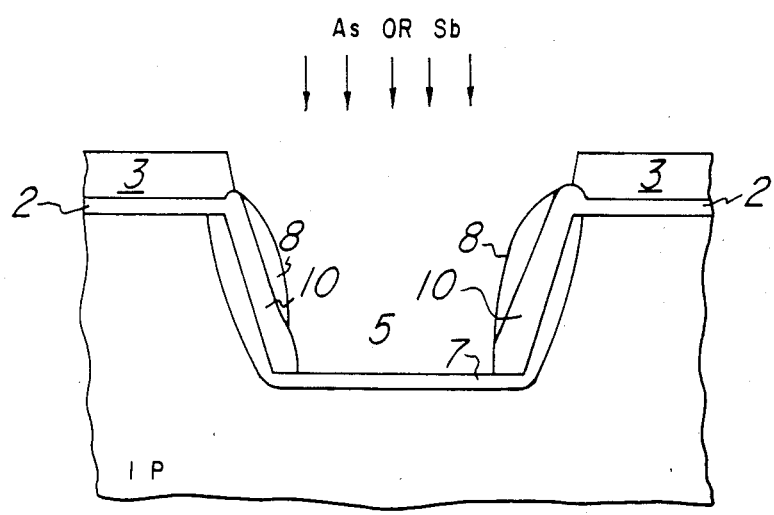
Figure 1E:
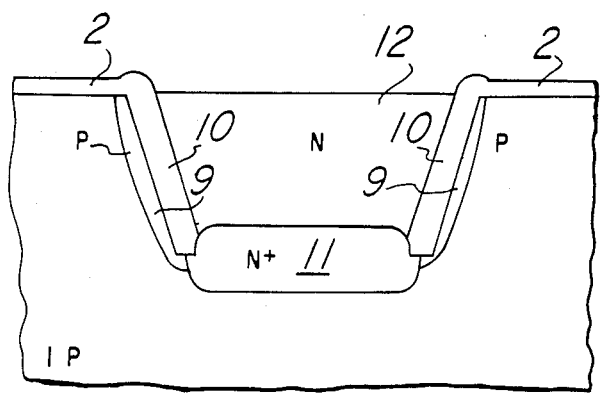

The structure of FIG. 1D is then subjected to an ion implantation of N type dopant ions such as arsenic ions or antimony ions, having an energy, in the example of arsenic ions, of approximately 100 kiloelectron volts and density of approximately $1 \times 10^{15}$ ions per centimeter squared. This heavy doping is sufficient to counter dope P+type region 7 and P type substrate 1 in the bottom surface of isolation region 5. All other regions of substrate 1 are shielded from this ion implantation by silicon dioxide layers 2 and 10, silcon nitride layer 3 and polycrystalline silicon filaments 8. Silicon nitride layers 3 are then removed using techniques well known in the art and the structure of FIG. 1D is subjected to a selective epitaxial deposition process to fill isolation region 5. This provides isolation region 12 as shown in FIG. 1E.

As isolation region 12 is deposited, N type dopant ions are introduced thereby, providing precise doping control of the N type region in isolation region 12 and the doping is completely independent of the doping level of substrate 1. Therefore, using the techniques of this embodiment of the present invention, the doping of the P type substrate and N type tanks (or vice versa) may be completely independent from one another whereas in the prior art the doping of P type substrate 1 was limited by the need to completely counter dope P type substrate 1 to form an N type tank. As isolation region 12 is formed by the aforementioned epitaxial process, polycrystalline filaments 8 of FIG. 1D are crystallized into isolation region 12. Polycrystalline filaments 8 provide good adhesion of isolation region 12 to sidewall oxide regions 10 while the selective epitaxial growth process does not adhere well to bare silicon dioxide sidewalls 10.

In the formation of isolation region 12 the crystalline structure induces an expanding crystalline formation from the bottom to the top. Because isolation region 5 of FIG. 1D was fabricated using orientation dependent etching, which is dependent upon the crystallographic orientation of substrate 1, isolation region 12 will form at approximately the same angle as the sides of isolation hole 5, thus providing a minimum of outward pressure. This feature minimizes the possibility of stress induced defects in substrate 1 and isolation region 12 which might be fabricated if isolation hole 5 were formed having vertical sidewalls according to another embodiment of the present invention (not shown).

Figure 2:
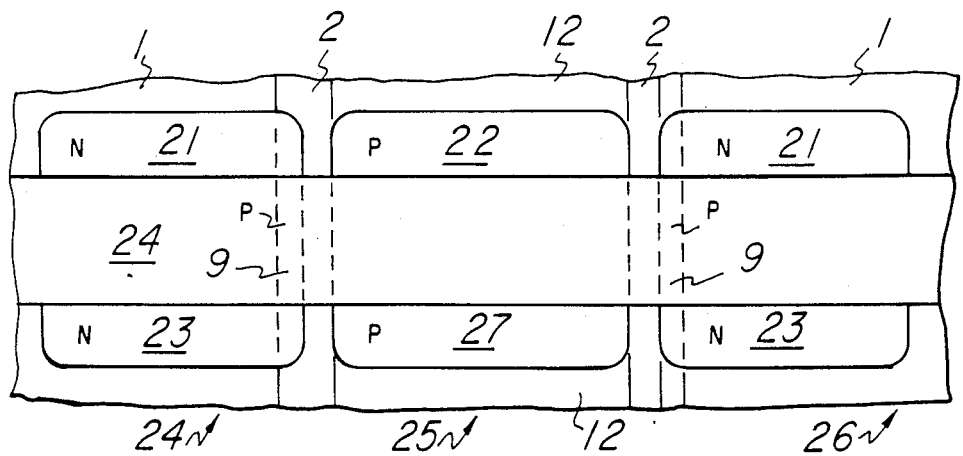
FIG. 2 is a plan view of three CMOS transistors having interconnected gates fabricated using the process and structure of this invention.

The purpose of P type regions 9 can be better understood with regard to FIG. 2. A common circuit combination of CMOS circuitry has the gates of transistors of opposite conductivity types connected together as shown in FIG. 2. N channel transistor 24, P channel transistor 25 and N channel transistor 26 all share gate 24. Using the described embodiment of the present invention these three transistors are separated by isolation regions providing complete isolation while only occupying a surface area between isolated regions of 2000 angstroms. N type source regions 21, P type source regions 22, P type drain region 27 and N type source/drain regions 23 are fabricated using techniques well known in the art.

When silicon dioxide interfaces with P type crystalline semiconductor material, a small intrinsic N type layer is formed at the interface between the two regions. In the described embodiment of the present invention, this intrinsic N type region is counter doped by P type regions 9. If P type regions 9 were not included, the intrinsic N type regions would form a leakage path between source regions 21 and drain regions 23.

While specific embodiments and examples are disclosed in this specification, these are not to be construed as limiting the scope of the invention. Many other embodiments of the present invention will become obvious to those skilled in the art in light of the teachings of this specification. The scope of the invention is only limited by the claims appended to hereto.

TECHNICAL ADVANTAGES

The described embodiments of the present invention provides a method for fabricating extremely narrow isolation regions while providing complete isolation between the isolation region and the substrate. In addition, the described embodiment of the present invention provides a method for providing tank regions having a doping completely independent of the doping of the substrate. These factors combine to provide, for example, CMOS integrated circuitry of extremely high density.

I claim:
1. A process for fabricating isolation regions in integrated circuitry comprising the steps of:
 (a) providing a substrate;
 (b) forming a depression in said substrate;
 (c) forming insulating material on the sidewalls of said depression;
 (d) then forming a layer of polycrystalline silicon over said sidewalls; and
 (e) forming crystalline semiconductor material in said depression.

2. A process for fabricating isolation regions as in claim 1 wherein said substrate comprises crystalline silicon.

3. A for fabricating isolation regions as in claim 1 wherein said depression is formed using orientation dependent etching.

4. A process for fabricating isolation regions as in claim 1, further including the step of forming sloped sidewalls in said depression, further comprising a step of doping a regions of said substrate under said sloped sidewalls.

5. A process for fabricating isolation regions as in claim 1 wherein said insulating material is selected from the group of silicon dioxide and silicon nitride.

6. A process for fabricating isolation regions as in claim 1 wherein said crystalline semiconductor material formed in said depression is formed by selective epitaxial formation.

7. A process for fabricating isolation regions as in claim 1 further comprising the step of forming a doped region of opposite conductivity type of said substrate in the bottom of said depression.

8. A process as set forth in claim 1 wherein said crystalline semiconductor material formed in step (e) is formed over said layer of polycrystalline material over said sidewalls.

9. A process for fabricating isolation regions in integrated circuitry comprising the steps of:
   providing a crystalline silicon substrate;
   etching said substrate to form a depression in said substrate having sloped sidewalls;
   thermally forming a layer of silicon dioxide on the surface of said substrate and in said depression;
   depositing a masking layer on the surface of said layer of silicon dioxide;
   etching said masking layer using an anisotropic etching process thus leaving said masking layer on said layer of silicon dioxide at the sides of said depression;
   removing said layer of silicon dioxide at the bottom of said depression;
   forming a doped region in the bottom of said depression; and forming, by selective epitaxy, crystalline silicon in said depression.

10. A process for fabricating isolation regions as in claim 9 further comprising the step of forming a doped region of opposite conductivity type of said substrate in the bottom of said depression.

11. A process for fabricating isolation regions in integrated circuitry comprising the steps of:
   (a) providing a silicon substrate of predetermined conductivity type;
   (b) forming an insulating layer over a surface of said substrate;
   (c) forming an etching pattern of predetermined shape over said insulating layer;
   (d) etching said insulating layer and said substrate through said resist layer to form a well in said substrate;
   (e) placing a dopant of said predetermined conductivity type beneath the surface of the exposed portion of said substrate;
   (f) removing said etching pattern;
   (g) forming a silicon oxide layer on the sidewalls and bottom of said well;
   (h) forming a layer of polycrystalline silicon over said oxide layer on said sidewalls;
   (i) removing said silicon oxide from the bottom of said well;
   (j) implanting a dopant of opposite conductivity type in the bottom of said well; and
   (k) filling said well with crystalline silicon of said opposite conductivity type.

12. A process for fabricating isolation regions in integrated circuitry as set forth in claim 11 wherein said step of etching said substrate includes orientation dependent etching to provide sloping sidewalls in said well.

* * * * *